United States Patent
Vervoort et al.

(10) Patent No.: US 7,982,309 B2
(45) Date of Patent: Jul. 19, 2011

(54) INTEGRATED CIRCUIT INCLUDING GAS PHASE DEPOSITED PACKAGING MATERIAL

(75) Inventors: Louis Vervoort, Pielenhofen (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 64 days.

(21) Appl. No.: 11/706,586

(22) Filed: Feb. 13, 2007

(65) Prior Publication Data

US 2008/0191344 A1    Aug. 14, 2008

(51) Int. Cl.
*H01L 23/06* (2006.01)
*H01L 21/00* (2006.01)

(52) U.S. Cl. ........ 257/729; 257/669; 257/678; 257/701; 257/788; 257/E23.191

(58) Field of Classification Search .................. 257/678, 257/690, 693, 702, 787, 792, 669, 688, 701, 257/729, 730, 788, E23.191
See application file for complete search history.

(56) References Cited

U.S. PATENT DOCUMENTS

| | | | |
|---|---|---|---|
| 6,181,569 B1 | 1/2001 | Chakravorty | |
| 6,350,668 B1 | 2/2002 | Chakravorty | |
| 6,515,355 B1* | 2/2003 | Jiang et al. | 257/678 |
| 6,548,912 B1* | 4/2003 | Graff et al. | 257/787 |
| 6,908,784 B1 | 6/2005 | Farnworth et al. | |
| 6,964,915 B2 | 11/2005 | Farnworth et al. | |
| 7,029,949 B2 | 4/2006 | Farnworth et al. | |
| 7,064,010 B2 | 6/2006 | Farnworth et al. | |
| 2004/0040738 A1* | 3/2004 | Tani et al. | 174/250 |
| 2005/0200028 A1* | 9/2005 | Farnworth et al. | 257/774 |
| 2006/0267218 A1* | 11/2006 | Hozoji et al. | 257/782 |
| 2007/0215997 A1* | 9/2007 | Standing | 257/678 |

OTHER PUBLICATIONS

Zweben, Carl, "Advances in Materials for Optoelectronic, Microelectronic and Moems/Mems Packaging." Mar. 14, 2002, 18th IEEE Semi-Therm Symposium, pp. 30-34.*

* cited by examiner

*Primary Examiner* — Hung Vu
*Assistant Examiner* — Vernon P Webb
(74) *Attorney, Agent, or Firm* — Dicke, Billig & Czaja, PLLC

(57) ABSTRACT

An integrated circuit includes a substrate including an active area and a gas phase deposited packaging material encapsulating the active area.

18 Claims, 4 Drawing Sheets

INTEGRATED CIRCUIT INCLUDING GAS PHASE DEPOSITED PACKAGING MATERIAL

BACKGROUND

Integrated circuits or semiconductor chips are typically encapsulated in a protective and insulating packaging material. The packaging material should provide a good balance between physical and chemical properties and costs. For typical semiconductor chips, the package is fabricated by a mould process involving hydraulic machines. The hydraulic machines are not compatible with front end cluster tools for gas phase deposition. The fabrication process of the package is not integrated into the fabrication process of the other functional layers of the semiconductor chip. Therefore, the mould process does not benefit from the cost down-scaling provided by front end processes.

For front end processes, the cost per semiconductor chip is approximately linear to the chip's surface area. The linear approximation of cost, however, is not applicable to the mould process. For instance, smaller chips in the same package require a higher quantity of encapsulation material or smaller chips per wafer require more packages and therefore more mould material and production capacity. The costs for the mould material and the mould process are typically high, especially for power semiconductors.

In addition, for very small semiconductor chips, the fluid mechanics of mould materials may not be compatible with the isolation, humidity resistance, or temperature resistance requirements of the semiconductor chips. In fact, voids may be created within the mould material and/or imperfections of the adhesion may result between the active layers of the semiconductor chips and the package layer of the semiconductor chips.

Further, the mould process throughput is relatively low. The fabrication process flow of the semiconductor chips is interrupted for the mould process and continued ex-situ. Because the fabrication process flow is interrupted and continued ex-situ, the contamination risk to the semiconductor chips is high. The contamination risk increases as the semiconductor chips get smaller.

In addition, the mould process results in thermal-mechanical stresses on the semiconductor chips. The mould process typically has a mould temperature of about 175° C. Due to the moulding temperature, there is significant thermal-mechanical stress on the semiconductor chips at room temperature, and the thermal-mechanical stress on the semiconductor chips increases as the temperature of the semiconductor chips decreases.

For these and other reasons, there is a need for the present invention.

SUMMARY

One embodiment provides an integrated circuit. The integrated circuit includes a substrate including an active area and a gas phase deposited packaging material encapsulating the active area.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
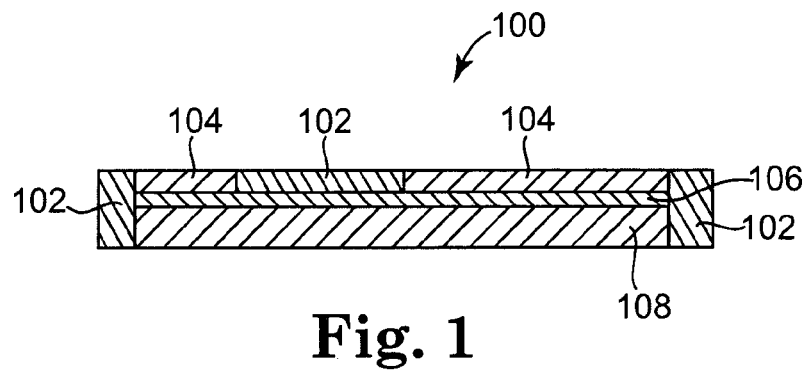
FIG. 1 illustrates a cross-sectional view of one embodiment of a semiconductor device.

FIG. 1 illustrates a cross-sectional view of one embodiment of an integrated circuit or semiconductor device 100. Semiconductor device 100 includes packaging material 102, frontside metal contacts 104, active area 106, and backside metal 108. Frontside metal contacts 104 contact the frontside of active area 106. Backside metal 108 contacts the backside of active area 106. Active area 106 includes transistors, diodes, or other suitable devices formed in a silicon substrate or other suitable substrate. Packaging material 102 laterally surrounds frontside metal contacts 104 and backside metal 108 and encapsulates active area 106.

Semiconductor device 100 is encapsulated with packaging material 102 by using a gas phase deposition process, such as a chemical vapor deposition (CVD) process instead of a mould process. The gas phase deposition process is fully compatible with front end processes. The packaging material can be applied to several wafers simultaneously, which provides high throughput and lower process costs compared to a mould process. The packaging material can be applied in thin layers (e.g., less than 100 μm); therefore the material costs are low.

Packaging material 102 provides a high insulating capacity and intrinsic layer adhesion due to the molecular gas phase deposition process. The entire encapsulation process flow is performed in-situ. Since the entire encapsulation process flow is performed in-situ, the contamination risk is reduced compared to a mould encapsulation process. In addition, the gas phase deposition process can be performed at room temperature. Therefore, there is no thermal-mechanical stress on the semiconductor device at room temperature if the coefficient of thermal expansion (CTE) of packaging material 102 is not adjusted to the CTE of the silicon of the semiconductor chip.

In one embodiment, packaging material 102 is a plasmapolymer. In one embodiment, the plasmapolymer is a Parylene, such as Parylene C, Parylene N, or Parylene D. Parylene C provides a useful combination of chemical and physical properties plus a very low permeability to moisture, chemicals and other corrosive gases. Parylene C has a melting point of 290° C. Parylene N provides high dielectric strength and a dielectric constant that does not vary with changes in frequency. Parylene N has a melting point of 420° C. Parylene D maintains its physical strength and electrical properties at higher temperatures. Parylene D has a melting point of 380° C.

In another embodiment, packaging material layer 102 includes an amorphous inorganic or ceramic carbon type layer. The amorphous inorganic or ceramic carbon type layer has an extremely high dielectrical breakthrough strength and a coefficient of thermal expansion (CTE) of about 2-3 ppm/K, which is very close to the CTE of silicon of about 2.5 ppm/K. Therefore, the thermal-mechanical stress between the silicon and packaging material layer 102 is low. In addition, the amorphous inorganic or ceramic carbon type layer has a temperature stability up to 450-500° C.

Figure 2:
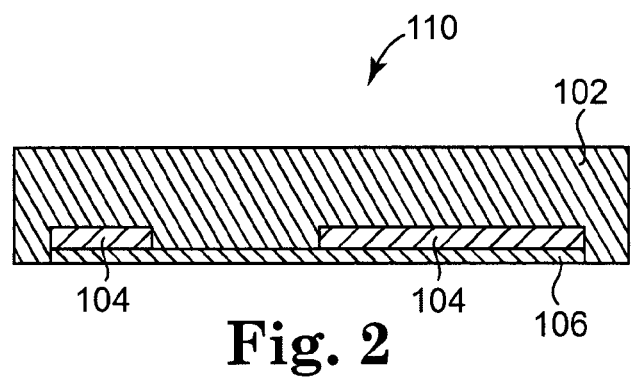
FIG. 2 illustrates a cross-sectional view of another embodiment of a semiconductor device.

FIG. 2 illustrates a cross-sectional view of another embodiment of a semiconductor device 110. Semiconductor device 110 includes packaging material 102, frontside metal contacts 104, and active area 106. Frontside metal contacts 104 contact the frontside of active area 106. Active area 106 includes transistors, diodes, or other suitable devices formed in a silicon substrate or other suitable substrate. Packaging material 102 encapsulates frontside metal contacts 104 and the top and sides of active area 106.

In this embodiment, a thick layer of packaging material 102 is deposited using gas phase deposition over frontside metal contacts 104 and active area 106. The thick layer of packaging material 102 gives support to the thin active area 106 and simplifies handling of semiconductor device 110. The thick layer of packaging material 102 prevents bending and cracking of thin active area 106.

Figure 3:
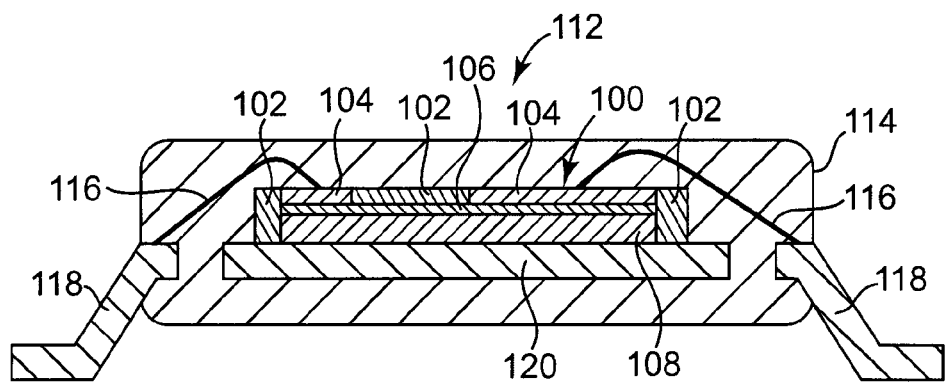
FIG. 3 illustrates a cross-sectional view of another embodiment of a semiconductor device.

FIG. 3 illustrates a cross-sectional view of another embodiment of a semiconductor device 112. Semiconductor device 112 includes semiconductor device 100 previously described and illustrated with reference to FIG. 1, bond wires 116, leadframe 120, leads 118, and mould package 114. Semiconductor device 100 is mounted on leadframe 120 such that backside metal 108 contacts leadframe 120. Each bond wire 116 electrically couples a frontside metal contact 104 to a lead 118. Mould package 114 encapsulates semiconductor device 100, bond wires 116, and leadframe 120. In this embodiment, packaging material 102 serves as isolation and/or as a thinning carrier during the thinning of the backside of the wafer during the fabrication process.

Figure 4:
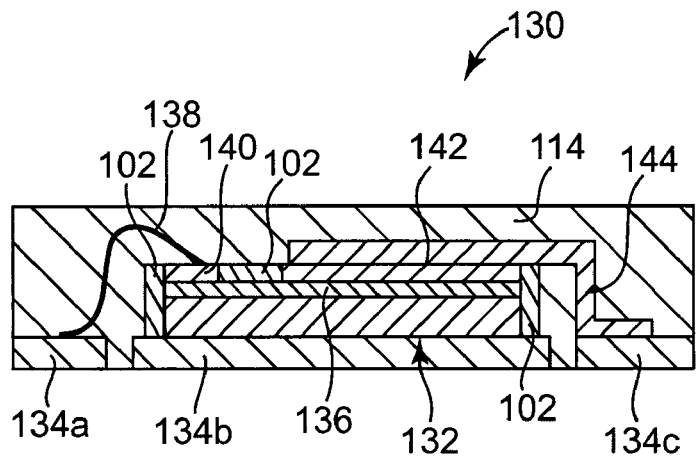
FIG. 4 illustrates a cross-sectional view of another embodiment of a semiconductor device.

FIG. 4 illustrates a cross-sectional view of another embodiment of a semiconductor device 130. Semiconductor device 130 includes a thinned vertical power transistor 132, a leadframe 134 including portions 134a, 134b, and 134c, bond wire 138, metal clip 144, and mould package 114. Power transistor 132 includes a gate electrode 140, a source electrode 142, a drain electrode 136, and an active area 106. The frontside of power transistor 132 includes the small gate electrode 140 and the large source electrode 142. The drain electrode 136 of power transistor 132 is on the backside of power transistor 132. The large area of source electrode 142 and the large area of drain electrode 136 allow a large current to flow from the frontside to the backside of power transistor 132. Packaging material 102 laterally surrounds gate electrode 140, source electrode 142, and drain electrode 136 and encapsulates active area 106.

Power transistor 132 is soldered onto leadframe portion 134b. Gate electrode 140 is electrically coupled to leadframe portion 134a through bond wire 138. Source electrode 142 is electrically coupled to leadframe portion 134c through metal clip 144. Metal clip 144 can carry currents from 1 A up to 100 A due to its larger cross-section than a bond wire. Due to the thinning of power transistor 132, the on resistance of power transistor 132, which is the resistance between source electrode 142 (i.e., leadframe portion 134c) and drain electrode 136 (i.e., leadframe portion 134b) is minimized. Packaging material 102, which is applied using a gas phase deposition (e.g., CVD) process, provides passivation of active area 106 of power transistor 132. Packaging material 102 also stabilizes the wafer during the thinning process and during backside metallization. Both passivation of active area 106 and thinning of the wafer backside are important for a vertical power transistor.

Figure 5A:
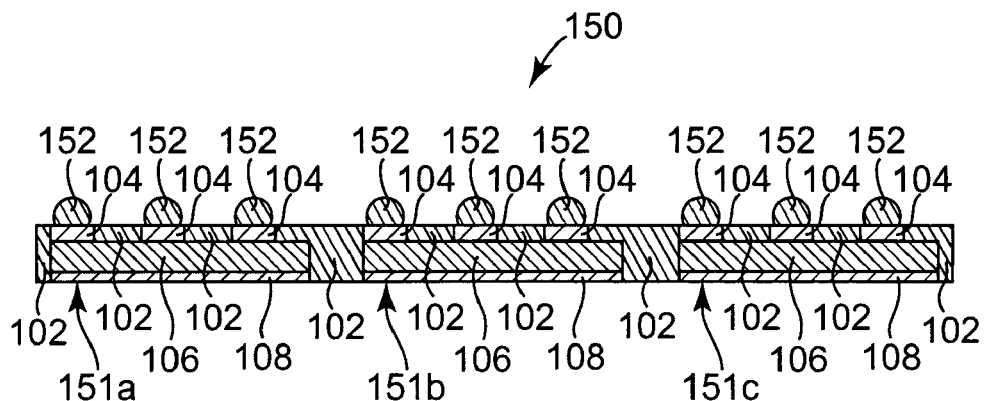
FIG. 5A illustrates a cross-sectional view of one embodiment of a semiconductor wafer.

FIG. 5A illustrates a cross-sectional view of one embodiment of a semiconductor wafer 150. Semiconductor wafer 150 includes dies 151a-151c. Each die 151a-151c includes packaging material 102, solder balls 152, frontside metal contacts 104, active areas 106, and backside metal 108. For each die 151a-151c, frontside metal contacts 104 contact the frontside of active area 106. Backside metal 108 contacts the backside of active area 106. Active area 106 includes transistors, diodes, or other suitable devices formed in a silicon substrate or other suitable substrate. Packaging material 102 laterally surrounds frontside metal contacts 104 and backside metal 108 and encapsulates active area 106. Solder balls 152 contact frontside metal contacts 104.

Solder balls 152 are applied to frontside metal contacts 104 at the wafer level. Due to the application of the solder balls 152 at the wafer level, production costs are minimized. With the solder balls 152 applied at the wafer level, the semiconductor chips can be completely manufactured at the wafer level, which improves throughput. In addition, chip-scale packages (CSPs) are obtained that use a minimum of space. After separating the die, the individual die or chips can be mounted directly onto a circuit board using flip-chip bonding.

Figure 5B:
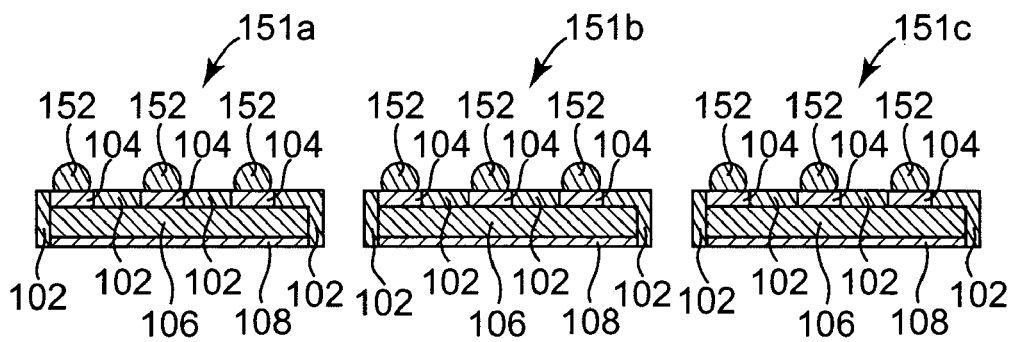
FIG. 5B illustrates a cross-sectional view of one embodiment of semiconductor devices after sawing the semiconductor wafer.

FIG. 5B illustrates a cross-sectional view of one embodiment of semiconductor chips 151a-151c after sawing semiconductor wafer 150. Semiconductor wafer 150 is sawed into individual semiconductor chips 150a-150c. By using packaging material 102, very small packages are provided. The packaging material 102 and the backside metallization 108 provide protection against humidity and mechanical stress. If packaging material 102 is selected to have an identical CTE as the semiconductor chip, the semiconductor chip does not experience thermal stress. In addition, the backside metallization also provides efficient cooling on the backside of the semiconductor chips. Further, the semiconductor chips 151a-151c include a short lead length due to the flip-chip design, which is particularly advantageous for power or radio frequency (RF) applications.

The following FIGS. 6-13 illustrate one embodiment of a method for fabricating a semiconductor device including wafer level encapsulation, such as semiconductor device 100 previously described and illustrated with reference to FIG. 1.

Figure 6:
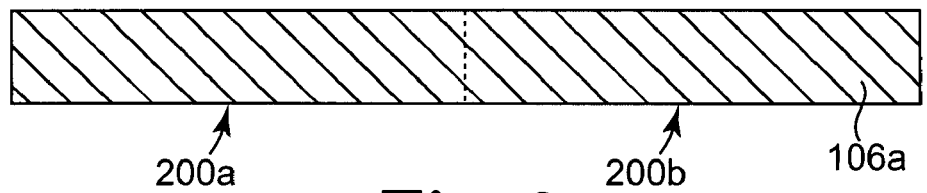
FIG. 6 illustrates a cross-sectional view of one embodiment of a semiconductor wafer.

FIG. 6 illustrates a cross-sectional view of one embodiment of a semiconductor wafer. The semiconductor wafer includes two die 200a and 200b. Each die 200a and 200b includes an active area 106a. Each active area 106a includes transistors, diodes, or other suitable devices formed in a silicon substrate or other suitable substrate.

Figure 7:
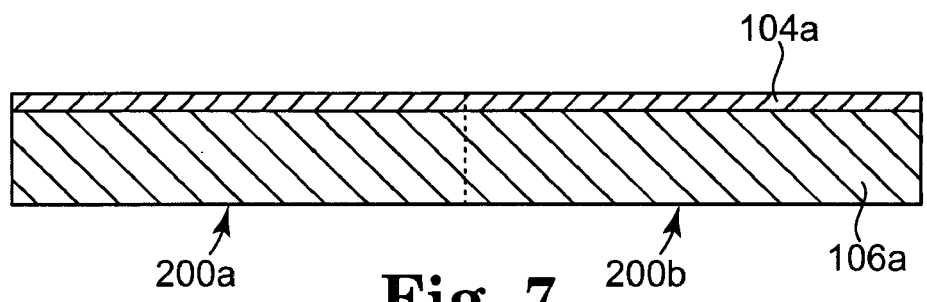
FIG. 7 illustrates a cross-sectional view of one embodiment of the semiconductor wafer after depositing a frontside metal layer.

FIG. 7 illustrates a cross-sectional view of one embodiment of the semiconductor wafer after depositing a frontside metal layer 104a over active areas 106a. A metal, such as TiN, TaN, W, Al, Ti, Ta, TiSiN, TaSiN, TiAlN, TaAlN, Cu, or other suitable metal is deposited over active areas 106a to provide frontside metal layer 104a. Frontside metal layer 104a is deposited using CVD, atomic layer deposition (ALD), metal organic chemical vapor deposition (MOCVD), plasma vapor deposition (PVD), jet vapor deposition (JVD), or other suitable deposition technique.

Figure 8:
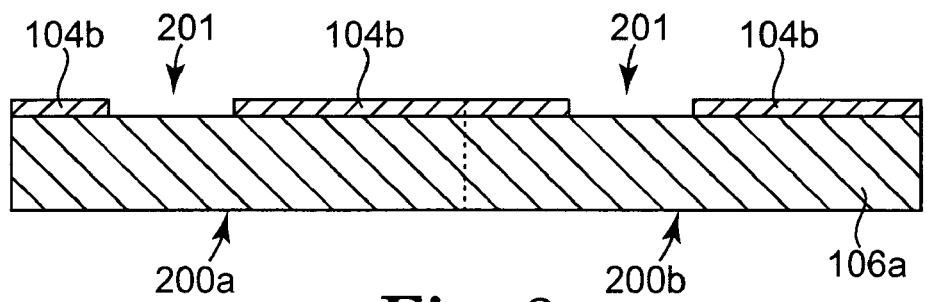
FIG. 8 illustrates a cross-sectional view of one embodiment of the semiconductor wafer after etching the frontside metal layer.

FIG. 8 illustrates a cross-sectional view of one embodiment of the semiconductor wafer after etching frontside metal layer 104a. Photolithography or other suitable lithographic process is used to pattern openings 201 for etching. Frontside metal layer 104a is etched to provide openings 201 exposing portions of active areas 106a and to provide frontside metal layer 104b.

Figure 9:
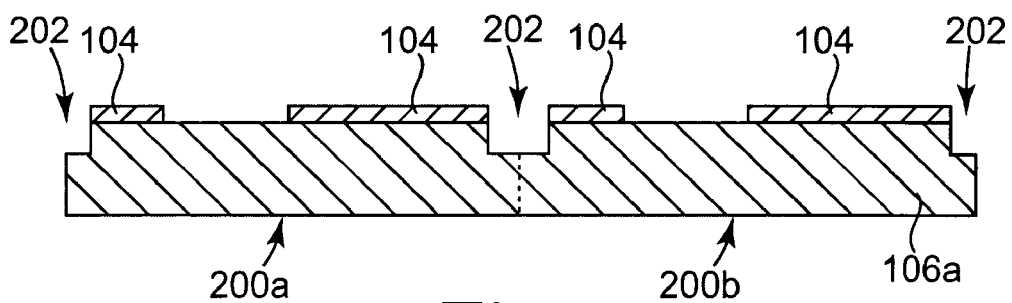
FIG. 9 illustrates a cross-sectional view of one embodiment of the semiconductor wafer after etching trenches in the semiconductor wafer.

FIG. 9 illustrates a cross-sectional view of one embodiment of the semiconductor wafer after etching trenches 202 into the semiconductor wafer. Photolithography or other suitable lithographic process is used to pattern trenches 202 between dies 200a and 200b for etching. Frontside metal layer 104b and active areas 106a are etched to provide trenches 202 and frontside metal contacts 104. Trenches 202 provide sawing streets for separating dies 200a and 200b in a later processing step.

Figure 10:
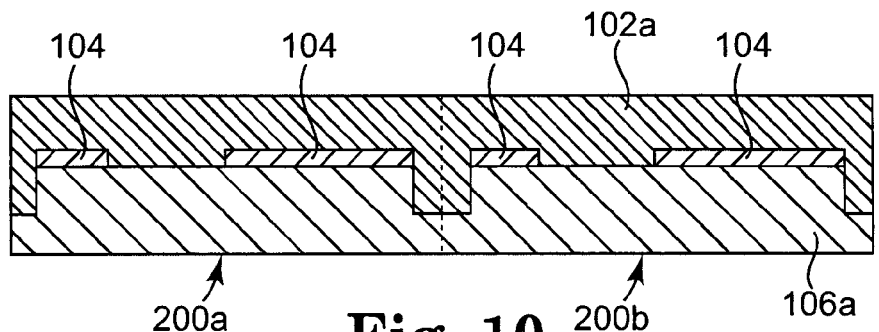
FIG. 10 illustrates a cross-sectional view of one embodiment of the semiconductor wafer after depositing a packaging material layer.

FIG. 10 illustrates a cross-sectional view of one embodiment of the semiconductor wafer after depositing a packaging material layer 102a. A packaging material, such as a plasmapolymer, amorphous inorganic or ceramic carbon, or other suitable packaging material is deposited over exposed portions of frontside metal contacts 104 and active areas 106a to provide packaging material layer 102a. Packaging material layer 102a is deposited using gas phase deposition, such as CVD. In one embodiment, packaging material layer 102a is deposited at room temperature.

In one embodiment, the gas phase deposited packaging materials are generated from evaporated organic molecules. The properties of the deposited packaging materials are determined by the type of organic precursors, the process parameters, and the flow of used oxygen, hydrogen, or other suitable gas during the deposition. Typical deposited layers can be parylenes (e.g., plasmapolymer with hydrogen content in the polymer backbone and therefore a relatively low flexural modulus), amorphous carbon layers (with a CTE close to silicon), or diamond like carbon (DCL), if the used gas precursors are simple hydrocarbon molecules and the added oxygen flow is high. According to the specific uses for the packaging material, coating, or encapsulant, a broad variety of material properties can be adjusted by the described gas phase processes.

Figure 11:
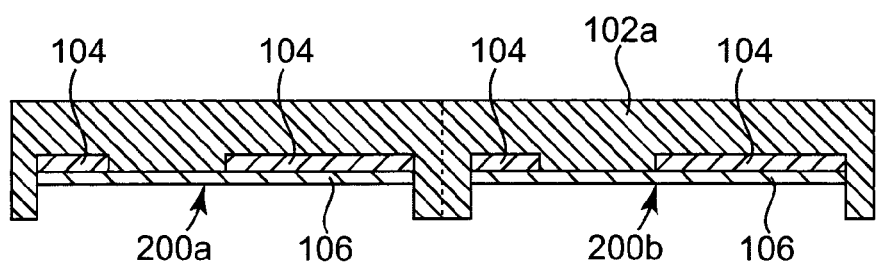
FIG. 11 illustrates a cross-sectional view of one embodiment of the semiconductor wafer after thinning the wafer backside.

FIG. 11 illustrates a cross-sectional view of one embodiment of the semiconductor wafer after thinning the wafer backside. The backside of active areas 106a are thinned by grinding and etching to provide thinned active areas 106. In other embodiments, the thinning of the wafer backside is skipped.

Figure 12:
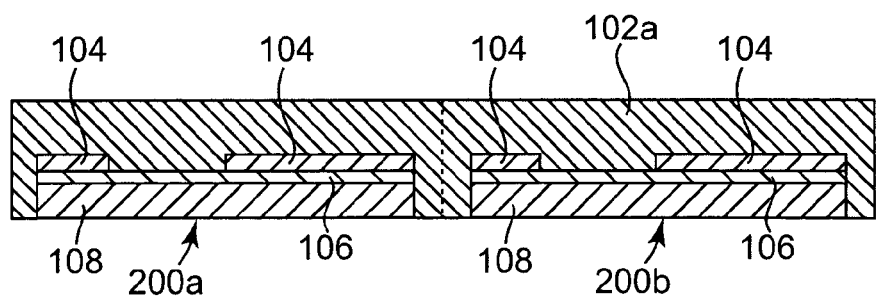
FIG. 12 illustrates a cross-sectional view of one embodiment of the semiconductor wafer after depositing a backside metal layer.

FIG. 12 illustrates a cross-sectional view of one embodiment of the semiconductor wafer after depositing a backside metal layer. A metal, such as TiN, TaN, W, Al, Ti, Ta, TiSiN, TaSiN, TiAlN, TaAlN, Cu, or other suitable metal is deposited over active areas 106. In one embodiment, the metal is planarized to remove any overshoot and to expose packaging material 102a and to provide backside metal 108. The metal is planarized using chemical mechanical planarization (CMP) or another suitable planarization technique. In other embodiments, the backside metallization is skipped to provide a semiconductor device similar to semiconductor device 110 previously described and illustrated with reference to FIG. 2.

Figure 13:
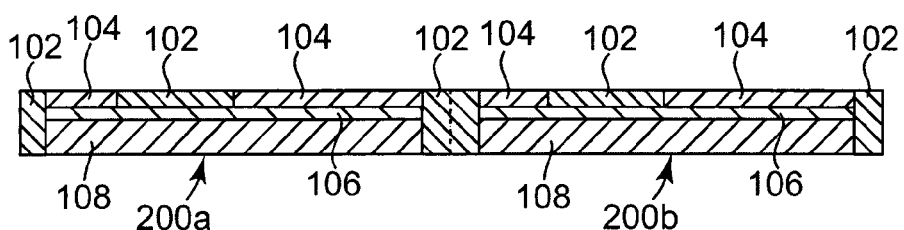
FIG. 13 illustrates a cross-sectional view of one embodiment of the semiconductor wafer after thinning the packaging material layer.

FIG. 13 illustrates a cross-sectional view of one embodiment of the semiconductor wafer after thinning the packaging material layer 102a. Packaging material layer 102a is thinned using CMP or another suitable planarization technique to expose frontside metal contacts 104 and provide packaging material layer 102. In other embodiments, the thinning of packaging material layer 102a is skipped if all contacts will be made through the backside. In one embodiment, solder balls are then applied to frontside metal contacts 104 to provide a semiconductor wafer similar to semiconductor wafer 150 previously described and illustrated with reference to FIG. 5A.

Dies 200a and 200b are then separated by sawing through packaging material 102 to provide semiconductor devices similar to semiconductor device 100 previously described and illustrated with reference to FIG. 1. If desired, dies 200a and 200b can be further packaged using a mould process to provide semiconductor devices similar to semiconductor device 112 previously described and illustrated with reference to FIG. 3 or semiconductor device 130 previously described and illustrated with reference to FIG. 4.

Embodiments of the present invention provide semiconductor devices encapsulated at the wafer level. A packaging material is deposited on a semiconductor wafer using gas phase deposition to encapsulate the active areas of the wafer. In addition, embodiments of the present invention provide a wafer level carrier to provide support during thinning of wafers and to simplify the handling of thinned wafers. A thick layer of packaging material is deposited on the semiconductor wafer using gas phase deposition to provide support for backside grinding and etching and for handling the thinned wafer after backside grinding and etching.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a semiconductor substrate including an active area on a frontside of the substrate;
   backside metal contacting a backside of the substrate, the backside of the substrate directly opposite the frontside of the substrate; and
   a gas phase deposited packaging material directly contacting and encapsulating the active area and directly contacting the backside metal,
   wherein the packaging material has a coefficient of thermal expansion between about 2-3 ppm/K.

2. The integrated circuit of claim 1, further comprising:
   contacts contacting the active area and extending through the packaging material.

3. The integrated circuit of claim 1, wherein the substrate comprises a thinned substrate.

4. The integrated circuit of claim 1, wherein the packaging material comprises an amorphous inorganic or ceramic carbon.

5. The integrated circuit of claim 1, wherein the packaging material has a thickness less than 100 μm.

6. A semiconductor wafer comprising:
   a semiconductor substrate including a plurality of dies, each die including an active area on a frontside of the substrate;
   backside metal contacting each die on a backside of the substrate, the backside of the substrate directly opposite the frontside of the substrate; and
   a gas phase deposited packaging material directly contacting and encapsulating the active area of each die, directly contacting the backside metal of each die, and providing sawing trenches between the dies,
   wherein the packaging material has a coefficient of thermal expansion between about 2-3 ppm/K.

7. The semiconductor wafer of claim 6, wherein the substrate comprises a thinned substrate.

8. The semiconductor wafer of claim 6, wherein the packaging material comprises an amorphous inorganic or ceramic carbon.

9. The semiconductor wafer of claim 6, wherein the packaging material has a thickness less than 100 μm.

10. The semiconductor wafer of claim 6, wherein the packaging material has a melting temperature above 370° C.

11. An integrated circuit comprising:
    a semiconductor substrate including an active area on a frontside of the substrate;
    backside metal contacting a backside of the substrate, the backside of the substrate directly opposite the frontside of the substrate; and
    a gas phase deposited packaging material directly contacting and encapsulating the active area and directly contacting the backside metal,
    wherein the packaging material is an amorphous inorganic or ceramic carbon.

12. The integrated circuit of claim 11, further comprising:
    contacts contacting the active area and extending through the packaging material.

13. The integrated circuit of claim 11, wherein the substrate comprises a thinned substrate.

14. The integrated circuit of claim 11, wherein the packaging material has a thickness less than 100 μm.

15. A semiconductor wafer comprising:
    a semiconductor substrate including a plurality of dies, each die including an active area on a frontside of the substrate;
    backside metal contacting each die on a backside of the substrate, the backside of the substrate directly opposite the frontside of the substrate; and
    a gas phase deposited packaging material directly contacting and encapsulating the active area of each die, directly contacting the backside metal of each die, and providing sawing trenches between the dies,
    wherein the packaging material is an amorphous inorganic or ceramic carbon.

16. The semiconductor wafer of claim 15, wherein the substrate comprises a thinned substrate.

17. The integrated circuit of claim 1, further comprising:
    a leadframe coupled to the backside metal,
    wherein the packaging material directly contacts the leadframe.

18. The integrated circuit of claim 11, further comprising:
    a leadframe coupled to the backside metal,
    wherein the packaging material directly contacts the leadframe.

* * * * *